United States Patent [19]

Tarui et al.

[11] Patent Number: 4,508,589
[45] Date of Patent: Apr. 2, 1985

[54] PROTECTIVE COATING STRIPPING APPARATUS

[75] Inventors: Yuichi Tarui; Toshio Obayashi, both of Hyogo, Japan

[73] Assignee: Marusho Industrial Co., Ltd., Tokyo, Japan

[21] Appl. No.: 559,615

[22] Filed: Dec. 8, 1983

[30] Foreign Application Priority Data

Dec. 8, 1982 [JP] Japan .................. 57-214011

[51] Int. Cl.³ .......................... B32B 31/16
[52] U.S. Cl. ................... 156/584; 118/118; 156/344
[58] Field of Search ............. 118/110, 118; 156/344, 156/568, 584; 29/426.5, 426.6

[56] References Cited

U.S. PATENT DOCUMENTS

| | | | |
|---|---|---|---|
| 3,536,571 | 10/1970 | Grundman | 156/584 |
| 3,684,628 | 8/1972 | Clarke et al. | 156/584 X |
| 4,183,751 | 1/1980 | Matsumoto et al. | 156/584 X |
| 4,190,244 | 2/1980 | Risi | 156/568 X |
| 4,279,687 | 7/1981 | Buchholz et al. | 156/568 |
| 4,414,056 | 11/1983 | Buchholz et al. | 156/476 |

Primary Examiner—Robert Dawson
Attorney, Agent, or Firm—Sughrue, Mion, Zinn, Macpeak & Seas

[57] ABSTRACT

An apparatus for stripping a protective coating from a substrate such as an architectural ornament or copper-plated resin board. First and second rotatable rollers are mounted parallel to one another with the spacing therebetween being adjustable. Discharge units are mounted above and below, respectively, the two rotatable rollers. An adhesive roller projects beyond the surface of each of the rollers through an aperture formed therein. Adhesive tape is wound around the adhesive rollers with the sticky side of the tape to the outside. A push rod is selectively extendible through an aperture formed in the rollers to the rear, in the direction of rotation of the rollers, the position of the adhesive rollers. Protective coating, taken up onto the surface of the rotatable rollers by action of the adhesive rollers, is transferred from the surface of the rotatable rollers to the discharge units, and then discharged to the outside.

5 Claims, 5 Drawing Figures

PROTECTIVE COATING STRIPPING APPARATUS

BACKGROUND OF THE INVENTION

The invention pertains to an apparatus for stripping a protective coating from a substrate.

Frequently, it is necessary to strip a protective coating from a substrate or other object prior to actual installation or use of the substrate or object. For example, an ornamental plate intended for architectural usage may be originally coated with polyethylene film for shipping and storage. Before the plate can be used, it is of course necessary to strip away the polyethylene film coating. Another use of such an apparatus is for stripping protective coatings from copper-plated laminar resin substrates which are used to form printed circuit boards. It is necessary to remove the plastic film with which the sheet is coated before the copper layers can be photolithographically processed.

The most common prior art approach to removing a protective coating from a substrate or the like is to do so manually. However, this approach requires a great amount of time, and is a fatigue-inducing task.

Accordingly, it is an object of the present invention to provide an apparatus for stripping away protective coatings which is capable of automatically and continuously stripping a protective coating from the surface of a substrate or other object.

SUMMARY OF THE INVENTION

In accordance with the above and other objects, the invention provides an apparatus for stripping a protective coating from a substrate which includes at least one roller, through a portion of the peripheral surface of which projects an adhesive member. A feeding mechanism feeds a substrate having a protective coating which is to be stripped into abutment with the roller such that the adhesive member contacts with the protective coating. A separator device, which is disposed within the roller behind, in the direction of rotation of the roller, the adhesive member, is provided for separating the stripped protective coating from the surface of the roller once it has been peeled from the surface of the substrate by the action of the adhesive member and rotation of the roller. A discharge device disposed adjacent the roller pulls the stripped-away protective coating from the surface of the roller and discharges it to the outside.

DESCRIPTION OF THE PREFERRED EMBODIMENTS

A preferred embodiment of an apparatus of the invention will now be described with reference to FIGS. 1 through 5.

Figure 1:
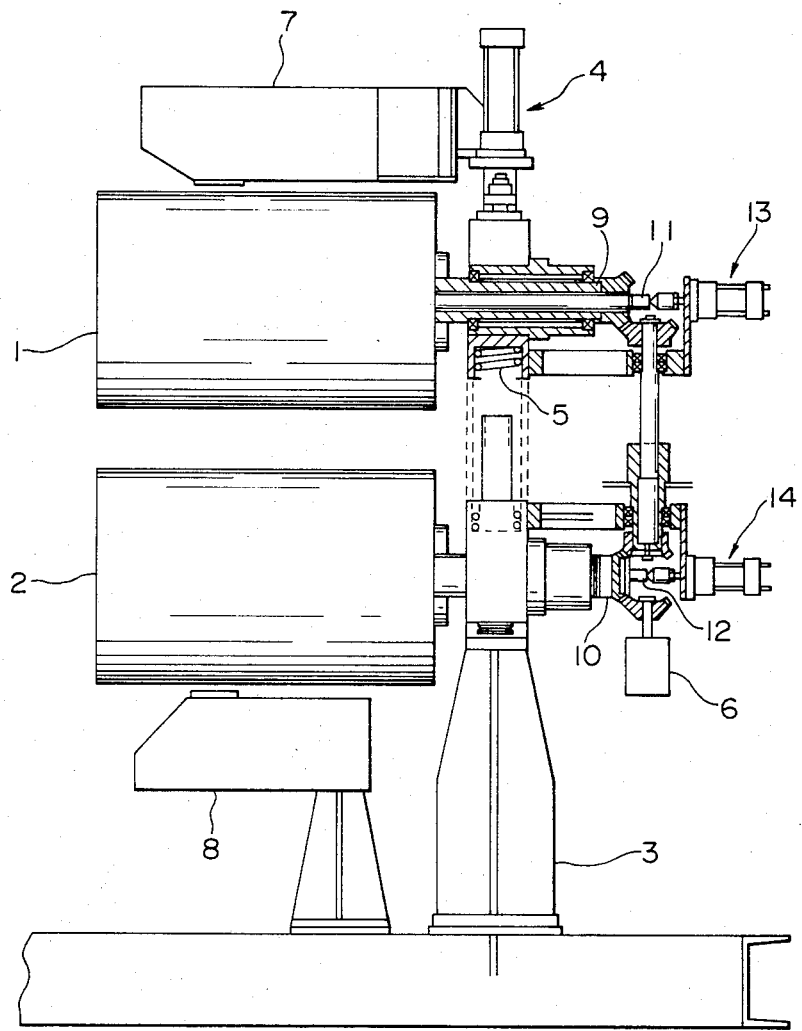
FIG. 1 is a side view, partially in cross-section, showing a protective coating stripping apparatus of the invention.

FIG. 1 is a side view, partially in cross-section, of a protective film stripping apparatus constructed in accordance with the teachings of the invention. In this apparatus, rotatable rollers 1 and 2 are mounted parallel to one another, supported at first ends thereof by a support member 3. The rollers 1 and 2 are rotatably driven through a bevel gear transmission by a motor 6. The distance between the shafts of the rollers 1 and 2 is adjustable by a drive mechanism 4, which may be implemented with a pneumatic cylinder or the like. The control rod of the pneumatic cylinder presses upon a shaft 9 of the roller 11 with a spring 5 opposing the force of the control rod.

Protective coating discharge units 7 and 8 are mounted above and below the rollers 1 and 2, respectively. Push rods 11 and 12, concentrically supported within the drive shafts 9 and 10 of the respective rods 11 and 12, extend outwardly from the ends of the shafts 9 and 10. The ends of the push rods are biased by drive devices 13 and 14, which again may be implemented with pneumatic cylinders or the like which are used to actuate the push rods selectively.

Figure 2:
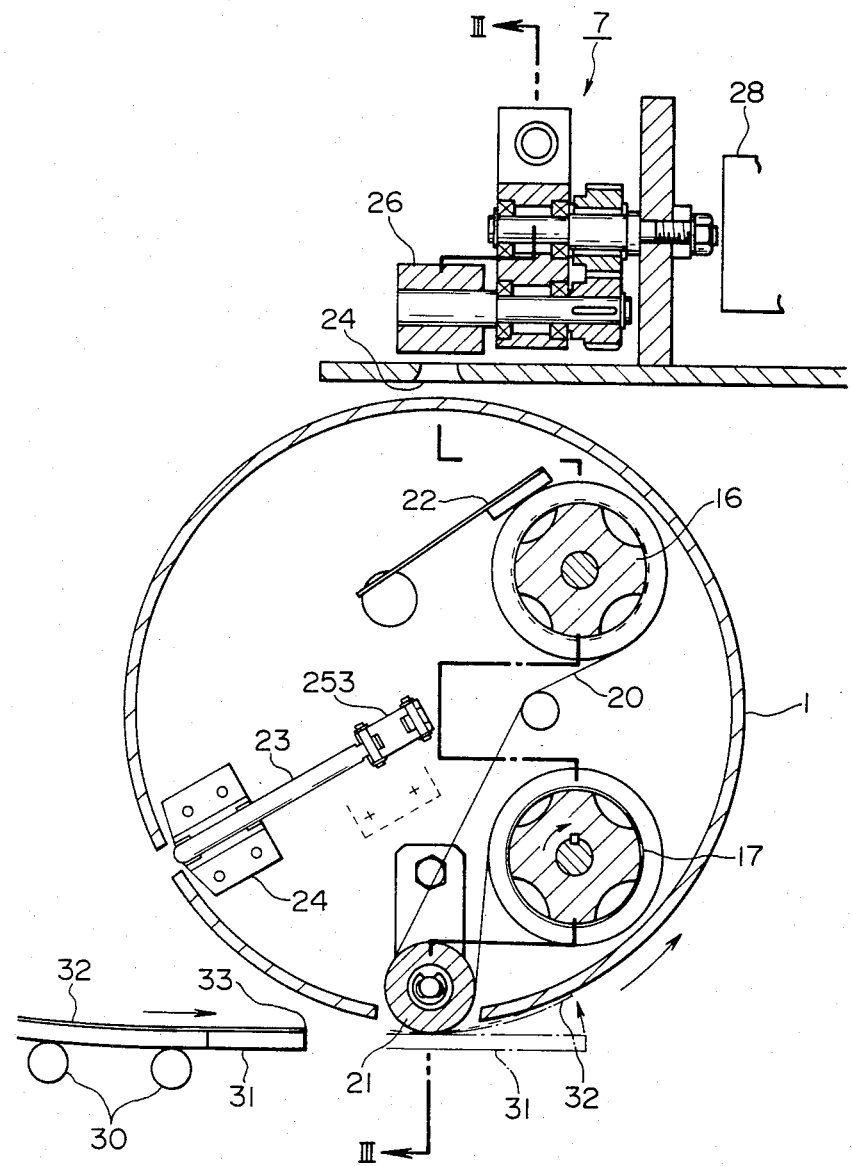
FIG. 2 is a cross-sectional view taken through a portion of the apparatus of FIG. 1 taken along a line II—II in FIG. 3.
Figure 3:
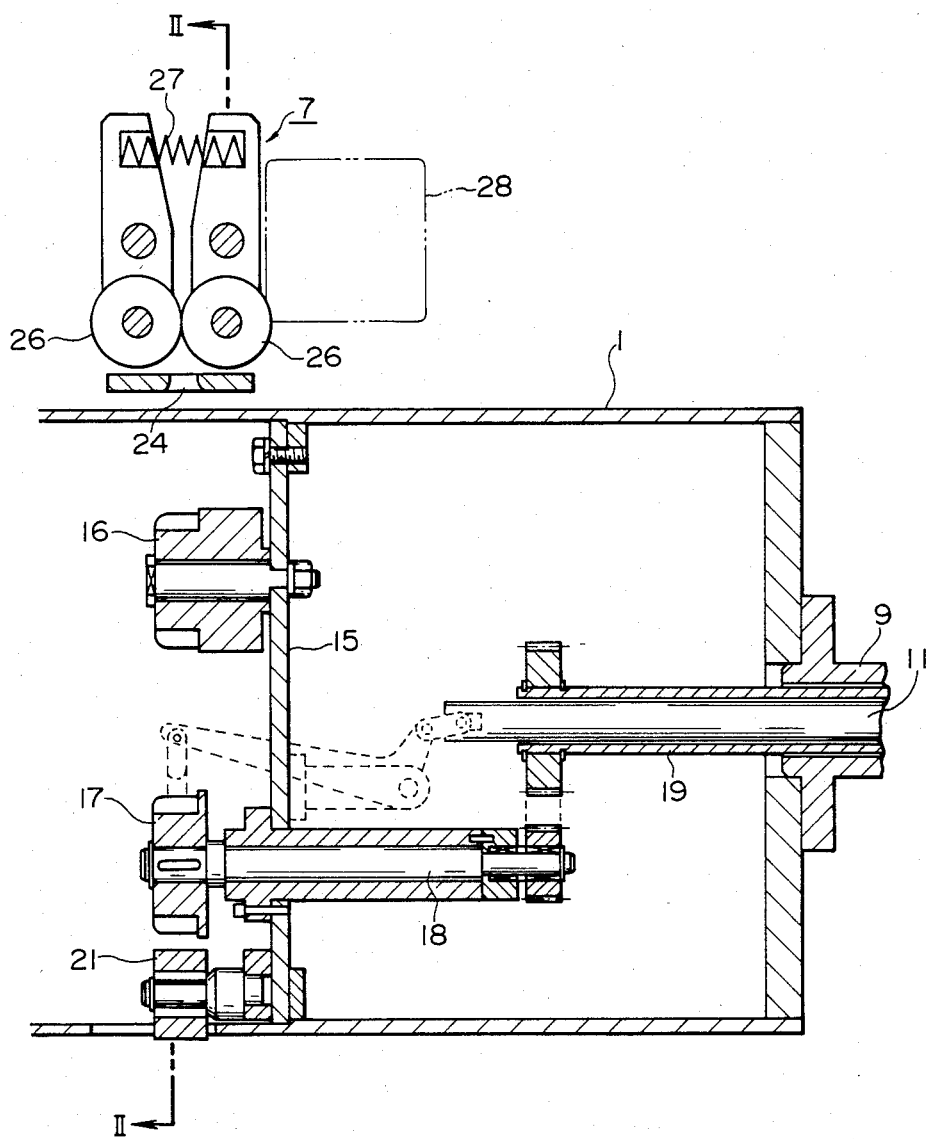
FIG. 3 is a cross-sectional view taken along a line III—III in FIG. 2.
Figure 4:
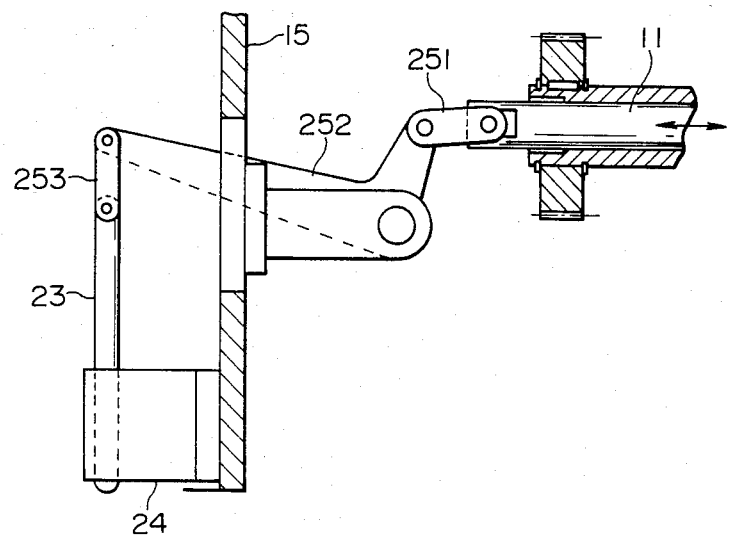
FIG. 4 is a partially cross-sectional view of a mechanism used for operating a projecting rod mounted on the inside of one of the rollers shown in FIG. 1.

The internal structure of one of the rollers and its adjacent protective coating discharge unit are depicted in FIGS. 2 and 3. In these figures, the internal structures of the roller 1 and the discharge unit 7 are shown, although the internal structures of the roller 2 and discharge unit 8 are similar. FIG. 2 is a partially cross-sectional view taken along a line II—II in FIG. 3, while FIG. 3 is a cross-sectional view taken along a line III—III in FIG. 2.

As shown in FIGS. 2 and 3, a support plate 15 is mounted within the roller 1, perpendicular to the shaft 9. A reel 16 is rotatably mounted on the support plate 15. An adhesive tape, such as cellophane tape or the like, is wound upon the reel 16. A take-up reel 17 is also journaled to the support plate 15. The take-up reel 17 is rotated from the outside. In the example here given, rotational power to the reel 17 is provided via a drive shaft 19, connecting gears, and a spindle 18. The drive shaft 19 is concentric with the shaft 9 of the roller 1. However, other drive mechanisms for the reel 17 can be employed.

Adhesive tape 20 wound on the adhesive tape reel 16 passes around an adhesive roller 21 with the sticky side of the tape on the outside. The lower periphery of the roller 21 projects through an aperture in the roller 1 slightly beyond the outer surface of the roller 1. After passing around the roller 21, the adhesive tape is wound up on the take-up reel 17. A brake 22 abuts against the periphery of the reel 16 to provide a braking force which prevents the adhesive tape from going slack during the operation of the apparatus.

Figure 5:
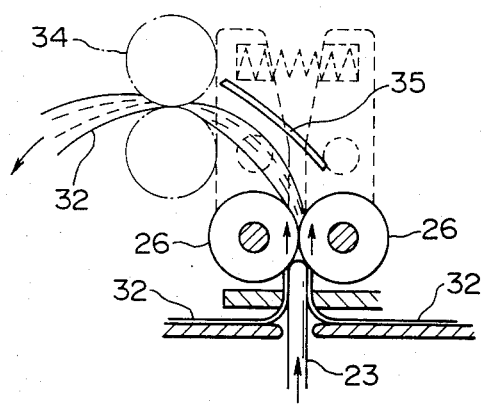
FIG. 5 is an explanatory diagram showing the manner in which a stripped protective coating is forcibly discharged to the outside.

A projecting rod 23 is carried by a support 24 mounted on the support plate 15. The purpose of the projecting rod 23 is to separate a protective coating 32 which has been stripped from a substrate 31 from the surface of the roller 1 once the protective coating 32 has been taken up onto the surface of the roller 1. An aperture is formed through the outer surface of the roller 1 through which the projecting rod can be selectively extended. The position of the aperture is somewhat behind, in the direction of rotation of the roller 1, the aperture through which the adhesive roller 21 projects. The projecting rod 23 is coupled via links 251, 252 and 253 to the push rod 11. The protective coating discharge unit 7 is mounted directly above the roller 1. An aperture 24 is formed in the bottom of the discharge unit 7 longitudinally opposite the aperture in the roller 1 through which the projecting rod 23 can be selectively extended. Further, the protective coating discharge unit 7 is provided above the aperture 24 with two rubber discharge rollers 26. An auxiliary guide 35 is disposed between the rollers 26 and a guide 34, as shown in FIG. 5, to compact the stripped protective coating as it entes the nip between the rollers 26.

As shown in FIG. 2, a pair of delivery rollers 30 is provided for feeding toward the roller 1 a laminated member composed of a substrate 31 coated with a protective coating 32. When the laminated member is fed toward the roller 1, the edge of the protective coating 32 should be fed into contact with the adhesive roller 21. This may be done by properly adjusting the position of the roller 1.

In use, the substrate 31, which may, for example, by a copper-plated resin sheet, which will ultimately form a printed circuit, having a protective coating 32 is fed toward the roller 1 with the edge 33 of the protective coating 32, which should be squared, fed against the adhesive roller 21. That is, the very edge of the upper surface of the coating 32 is contacted with the adhesive roller 21. The adhesive surface of the adhesive tape passing around the adhesive roller 21 lifts the end 33 of the protective coating 32 away from the substrate 31. Subsequent rotation of the roller 11 causes the protective coating 32 to be wound onto the surface of the roller 1, thereby peeling away the protective coating 32 as the substrate 31 is advanced toward the roller 1.

When the projecting rod 23 reaches a position opposite the aperture 24 of the protective coating discharge unit 7, the drive device 13 is actuated, thereby actuating the push rod 11 and hence causing the projecting rod 23 to be thrust by the links 251, 252 and 253 through the aperture 24. This pushes a portion of the stripped-away protective coating between the discharge rollers 26. The protective coating is then compacted by the action of the rollers 26, which are biased together by a spring 27. As shown in FIG. 5, the stripped-away protective coating passes guides 34 and 35, and then is forcibly discharged to the outside as the rollers 26 are rotated. It should of course be understood that the projecting rod 23 is immediately withdrawn after the protective coating 32 has been thrust between the rollers 26.

Once the protective coating has been completely removed, the substrate can be conveyed to the next processing station. It is to be noted that, with the apparatus of the present invention, it is not necessary to perform repeated separating actions if the substrate is longer than the circumference of the roller 1 since the protective coating 32 will be continuously pulled by the discharge rollers 26 until the end thereof has been reached. The projecting rod 23 should only be actuated once for each stripping operation. Also it may be desirable to move the adhesive roller 21 toward the interior of the roller 1 and out of contact with the protective coating 32 after the first rotation of the roller 1.

Although the invention has been described with reference to the operation of the roller 1 and the discharge unit 7, it goes without saying that the operation of the roller 2 and discharge unit 7 are identical. If a protective coating is present on both sides of a substrate, it is of course possible to strip away both protective coatings in a single operation with the apparatus of the invention using both upper and lower rollers and accompanying discharge units. Also, with the invention, substrates of varying thicknesses can be easily accommodated simply by adjusting the distance between the rollers 1 and 2 with the drive mechanism 4 shown in FIG. 1.

In the preferred embodiment of the invention described above, the periphery of the adhesive roller 21 projects slightly beyond the outer surface of the roller 1. However, if the surface of the substrate is not delicate, it is not necessary to cause the adhesive roller to project beyond the surface of the roller 1. In such a case, the periphery of the adhesive roller and the surface of the roller 1 can be flush.

Further, the invention has been described with reference to a case where an adhesive tape 20 is provided which passes around the adhesive roller 21. In this case, the take-up reel can be rotated to provide a fresh adhesive surface for each protective coating stripping operation. However, other arrangements are possible. Any adhesive device can be used so long as it is capable of taking up the leading edge of a protective coating. For instance, if the protective coating is formed of some types of plastic film and if the circumferential surface of the roller is made of metal, little adhesive force is required static electricity will provide a sufficiently strong force to hold such a protective coating to the surface of the roller 1.

Still further, arrangements other than the projecting rod described above can be used for separating the protective coating from the surface of the roller 1. For example, an air nozzle mounted in the same position as the projecting rod can be used. At the position where the projecting rod is actuated in the apparatus described above, compressed air is released through the nozzle, thereby separating the protective coating from the surface of the roller 1 and forcing it into the nip between the rollers 26. Another possibility is to provide a suction device on the side of the rollers 26.

Still further, after the protective coating has been taken up by the discharge rollers for discharge, if the speed at which the protective coating is discharged by the discharge unit 7 is the same as that at which the coating is fed toward the roiller 1, the roller 1 can be stopped and used as a sliding guide surface. This latter approach is effective especially when the substrate is longer than the circumference of the roller 1.

As described above, according to the invention, the leading edge of a protective coating carried by a substrate is peeled from the substrate by an adhesive member extending through an aperture in a rotating roller, thereby taking the protective coating onto the surface of the rotating roller. The protective coating is then separated from the rotating roller and forcibly discharged to the outside by a separate discharge unit. Accordingly, a protective coating can be continuously and automatically stripped from a substrate by a relatively simple apparatus without the need for a great deal of manual labor.

This completes the description of the preferred embodiments of the invention. Although preferred embodiments have been described, it is believed that numerous modifications and alterations thereto with the apparent to one having ordinary skill in the art without departing from the spirit and scope of the invention.

We claim:

1. An apparatus for stripping a protective coating from a substrate comprising: a rotatable roller; adhesive means disposed at a peripheral portion of said rotatable roller; means for feeding a substrate carrying a protective coating toward said rotatable roller at a position such that an edge of said protective coating is contacted with said adhesive means; separating means mounted on said rotatable roller, behind, in a direction of rotation of said rotatable roller, said adhesive means, for separating a protective coating taken up onto an outer surface of said rotatable roller from said outer surface of said rotatable roller; and discharge means disposed adjacent said rotatable roller for receiving said protective coating from said separating means.

2. The protective coating stripping apparatus of claim 1, wherein said adhesive means comprises: a roller having an edge portion projecting beyond an outer surface of said rotatable roller; and means for feeding an adhesive tape around said adhesive roller.

3. The protective coating stripping apparatus of claim 2, further comprising: a supply reel for holding a supply of said adhesive tape; brake means for supplying a braking force to said supply reel; a take-up reel, adhesive tape from said supply reel passing around said roller of said adhesive means to said take-up reel; and means for supplying rotational power to said take-up reel.

4. The protective coating stripping apparatus of claim 1, wherein said separating means comprises: a push rod; and links means for selectively extending said push rod to project beyond said outer surface of said rotatable roller.

5. The protective coating stripping apparatus of claim 4, wherein said discharge means comprises: a pair of spring-biased rubber rollers; and guide means for directing protective coating projected by said push rod into a nip between said rubber rollers.

* * * * *